United States Patent [19]

Ueda et al.

[11] Patent Number: 5,766,279
[45] Date of Patent: Jun. 16, 1998

[54] POLISHING AGENT, METHOD FOR PRODUCING THE SAME AND METHOD FOR POLISHING

[75] Inventors: Naruo Ueda; Norikazu Yamamoto; Kenzo Hanawa; Kazuhiko Kato, all of Saitama, Japan

[73] Assignee: Mitsui Mining and Smelting Co., Ltd., Tokyo, Japan

[21] Appl. No.: 719,617

[22] Filed: Sep. 25, 1996

[30] Foreign Application Priority Data

Nov. 7, 1995 [JP] Japan .................. 7-313621

[51] Int. Cl.$^6$ .................................................. C09G 1/02
[52] U.S. Cl. ........................ 51/308; 51/309; 106/3
[58] Field of Search ........................ 51/293, 308, 309; 106/3; 451/36; 156/636.1, 645

[56] References Cited

U.S. PATENT DOCUMENTS

| | | | |
|---|---|---|---|
| 4,769,073 | 9/1988 | Tastu et al. | 106/3 |
| 5,137,541 | 8/1992 | Foster | 106/3 |
| 5,264,010 | 11/1993 | Brancaleoni et al. | 106/3 |
| 5,389,352 | 2/1995 | Wang | 106/3 |
| 5,525,191 | 6/1996 | Manier et al. | 156/636.1 |

FOREIGN PATENT DOCUMENTS

| | | |
|---|---|---|
| 53-6756 | 3/1978 | Japan . |
| 64-40267 | 2/1989 | Japan . |
| 8-134435 | 5/1996 | Japan . |

*Primary Examiner*—Deborah Jones
*Attorney, Agent, or Firm*—Young & Thompson

[57] ABSTRACT

A fine particulate polishing agent is based on cerium oxide and silicon oxide; a slurry polishing agent comprises the foregoing fine particulate polishing agent which can be prepared by a method which comprises the steps of mixing, with stirring, cerium oxide fine particles, silica sol and a liquid; drying the mixture; mixing the material with a liquid; and then subjecting the mixture to deagglomeration using a wet pulverizing mill to give a slurry. Preferably, the dried particulate material is subjected to a thermal treatment at a high temperature of 150° to 1200° C., preferably 800° to 900° C., thereby to produce a solid solution of cerium oxide and silicon oxide. The slurry polishing agent can ensure the achievement of surface roughness comparable to or superior to that achieved by the colloidal silica polishing agents and a high polishing rate at least comparable to that achieved by the conventional cerium oxide polishing agents.

11 Claims, 7 Drawing Sheets

POLISHING AGENT, METHOD FOR PRODUCING THE SAME AND METHOD FOR POLISHING

BACKGROUND OF THE INVENTION

(1) Field of the Invention

The present invention relates to a fine particulate polishing agent based on cerium oxide, a stable slurry polishing agent comprising the polishing agent, a method for producing the slurry polishing agent, a polishing agent comprising cerium oxide solid solution and a one-stage method for precision polishing which makes use of the slurry polishing agent. More specifically, the present invention pertains to a polishing agent suitable for use in applications which require extremely high surface processing accuracy, for instance, polishing of a variety of glass materials which comprise, as principal components, silicon compounds, polishing of semiconductor materials such as silicon wafers and polishing of interlayer insulating films of silicon compounds in semiconductor device-manufacturing processes, as well as a method for producing the polishing agent and a method for polishing.

(2) Description of the Prior Art

In the techniques wherein the surfaces of vitreous materials are polished to a mirror finish, in particular, those which should satisfy the requirement for extremely fine surface roughness, the surface thereof has in general been polished using colloidal silica. Incidentally, the polishing with colloidal silica suffers from a problem of low polishing rate. Therefore, when a large amount of a material must be removed through polishing, the material is first polished, as a pre-polishing process, with a polishing agent which mainly comprises cerium oxide and can ensure a high polishing rate and then polished with colloidal silica, as disclosed in, for instance, Japanese Un-Examined Patent Publication (hereinafter referred to as "J. P. KOKAI") No. Sho 64-40267. Such a two-stage polishing process requires, for instance, the use of additional polishing installations and a superabundant time for switching over to the polishing with colloidal silica. This accordingly leads to a substantial reduction in the efficiency of work.

There has been increasingly a demand for polishing techniques which can ensure fine surface roughness and therefore, it is very important to develop a novel polishing agent which supersedes colloidal silica, i.e., a polishing agent capable of achieving surface roughness comparable to or finer than that attained by the colloidal silica polishing agent and capable of ensuring a polishing rate comparable to that observed for the cerium oxide polishing agent.

The applicant of this invention has proposed, in Japanese Patent Application Serial No. Hei 6-272761, a polishing agent for use in semiconductor device-manufacturing processes, which comprises cerium oxide having an average particle size of not more than 0.1 µm. The fine particulate polishing agent can ensure a good polishing rate even if the particles thereof have a very small particle size on the order of not more than 0.1 µm, unlike the conventional cerium oxide polishing agents and the polishing rate is substantially higher than that achieved by using the silica polishing agents.

If quartz glass is polished with the polishing agent comprising cerium oxide particles having such a small particle size, the glass surface thus polished has a quite fine surface roughness considerably smaller than that achieved by the conventional cerium oxide polishing agents. Nevertheless, the polishing rate is found to be almost comparable to that achieved by the latter. More specifically, the use of cerium oxide fine particles ensures the polishing rate comparable to that observed for the conventional cerium oxide polishing agents, while ensuring the surface roughness approximately identical to that observed for the colloidal silica polishing agents.

However, the foregoing fine particulate polishing agent of cerium oxide suffers from, for instance, the following problems. First, the cerium oxide particles show poor dispersibility in a medium (water) and this in turn makes it difficult to uniformly supply polishing agent fine particles to a polishing machine and a subject to be polished. Moreover, such a polishing agent shows high resistance which requires high torque to rotate the substrate. Therefore, the use thereof becomes a cause of various damages of the subject when it has a small thickness and any increase in the polishing pressure during polishing cannot be admitted when the polishing machine used is fragile. When the colloidal silica polishing agents are used, the polishing rate is quite susceptible to the pH value of the polishing liquid used and for this reason, the pH thereof should be maintained at a level of not less than 10 in order to ensure a polishing rate excellent in reproducibility. The polishing agent liquid having a pH of not less than 10 is very difficult for operators engaged in the polishing to handle the same and such a liquid is harmful to the operators.

SUMMARY OF THE INVENTION

Accordingly, it is, in general, an object of the present invention to solve the foregoing problems associated with the conventional polishing agents and more specifically to provide a fine particulate polishing agent which can ensure a polishing rate comparable to that observed for the conventional cerium oxide polishing agents, while ensuring the surface roughness approximately identical to that observed for the colloidal silica polishing agents; which can ensure a polishing rate excellent in reproducibility even at a pH falling within the neutral range; which has good dispersibility in a medium (water) and is stable therein and which requires low torque to rotate the substrate in processing.

Another object of the present invention is to provide a stable polishing agent in the form of a slurry (slurry polishing agent), comprising the foregoing fine particulate polishing agent.

Still another object of the present invention is to provide a method for preparing such a slurry polishing agent.

A further object of the present invention is to provide a one-stage method for precision polishing which makes use of the foregoing slurry polishing agent.

The inventors of this invention have conducted various studies to accomplish the foregoing objects of the present invention, and have found out that a stable slurry can be obtained by admixing silica sol and $CeO_2$ fine particles, followed by recovering and drying the mixture and then subjecting the mixture to deagglomeration.

According to an aspect of the present invention, there is provided a fine particulate polishing agent comprised of $SiO_2$ and $CeO_2$.

According to another aspect of the present invention, there is provided a polishing agent in the form of a slurry, which comprises the foregoing fine particulate polishing agent dispersed in a medium.

According to still another aspect of the present invention, there is provided a polishing agent which is a solid solution of $SiO_2$ and $CeO_2$.

According to a further aspect of the present invention, there is provided a method for preparing the foregoing slurry polishing agent comprising the steps of mixing, with stirring, cerium oxide fine particles, silica sol and a liquid; drying the mixture; optionally subjecting the dried particulate material to a thermal treatment at a high temperature and then cooling the material; mixing the material with a liquid; and then subjecting the mixture to deagglomeration using a wet pulverizing mill to give a slurry.

According to a still another aspect of the present invention, there is provided a one-stage method for precision polishing which comprises the step of polishing the surface of a substrate mainly comprising a silicon compound with the foregoing slurry polishing agent.

DESCRIPTION OF THE PREFERRED EMBODIMENTS

Figure 1:
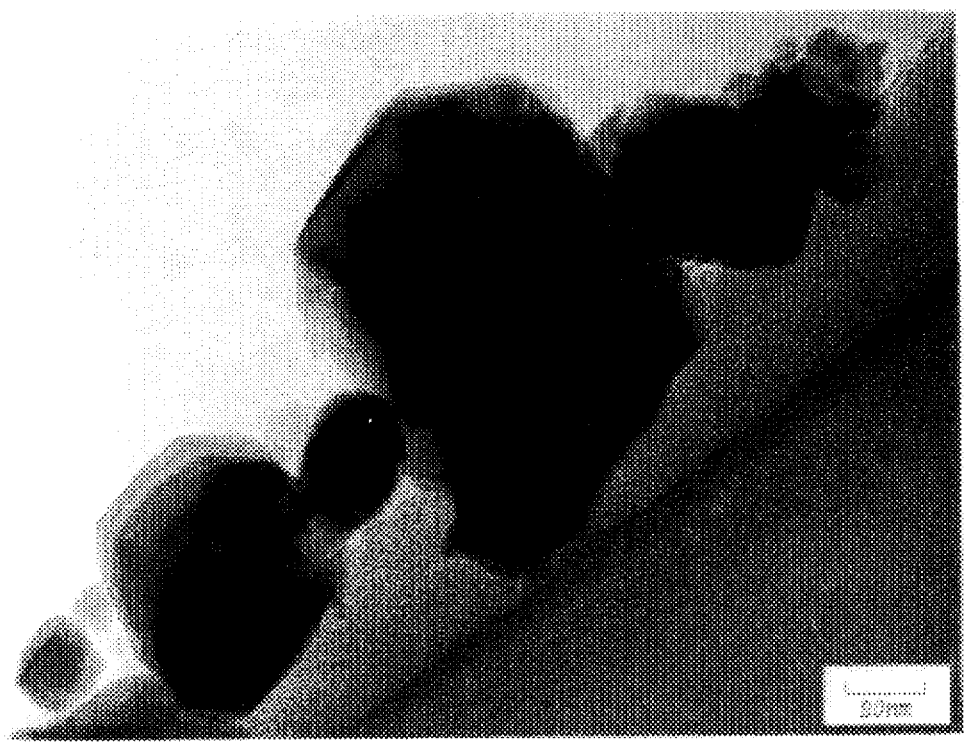
FIG. 1 is a transmission electron micrograph (magnifying power: 600,000) of the polishing agent (B) prepared in Example 1.
Figure 2:
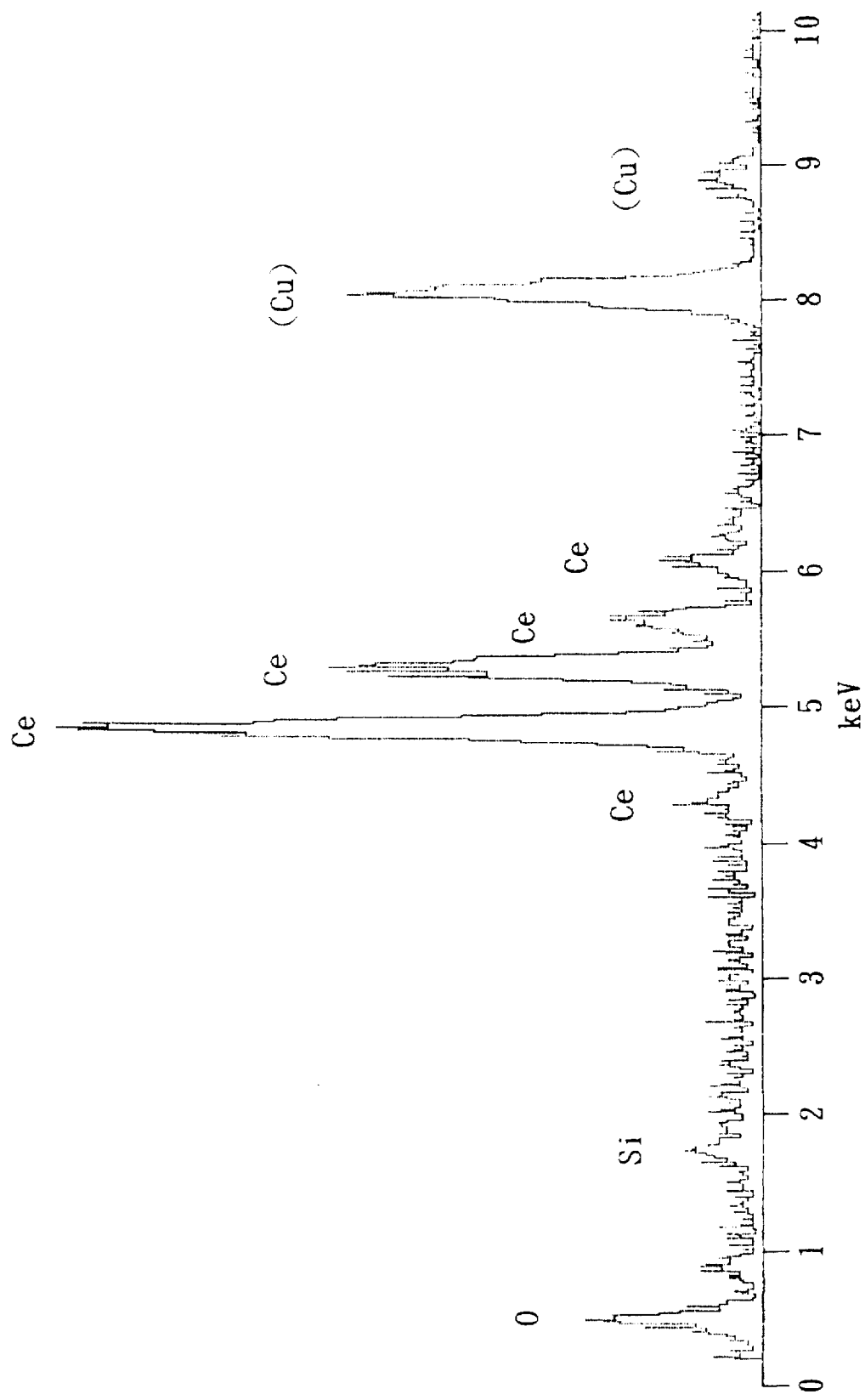
FIG. 2 is a chart obtained by energy dispersive X-ray spectroscopic elemental analysis (EDX elemental analysis) of a single particle taken from the slurry polishing agent (B) prepared in Example 1.
Figure 3:
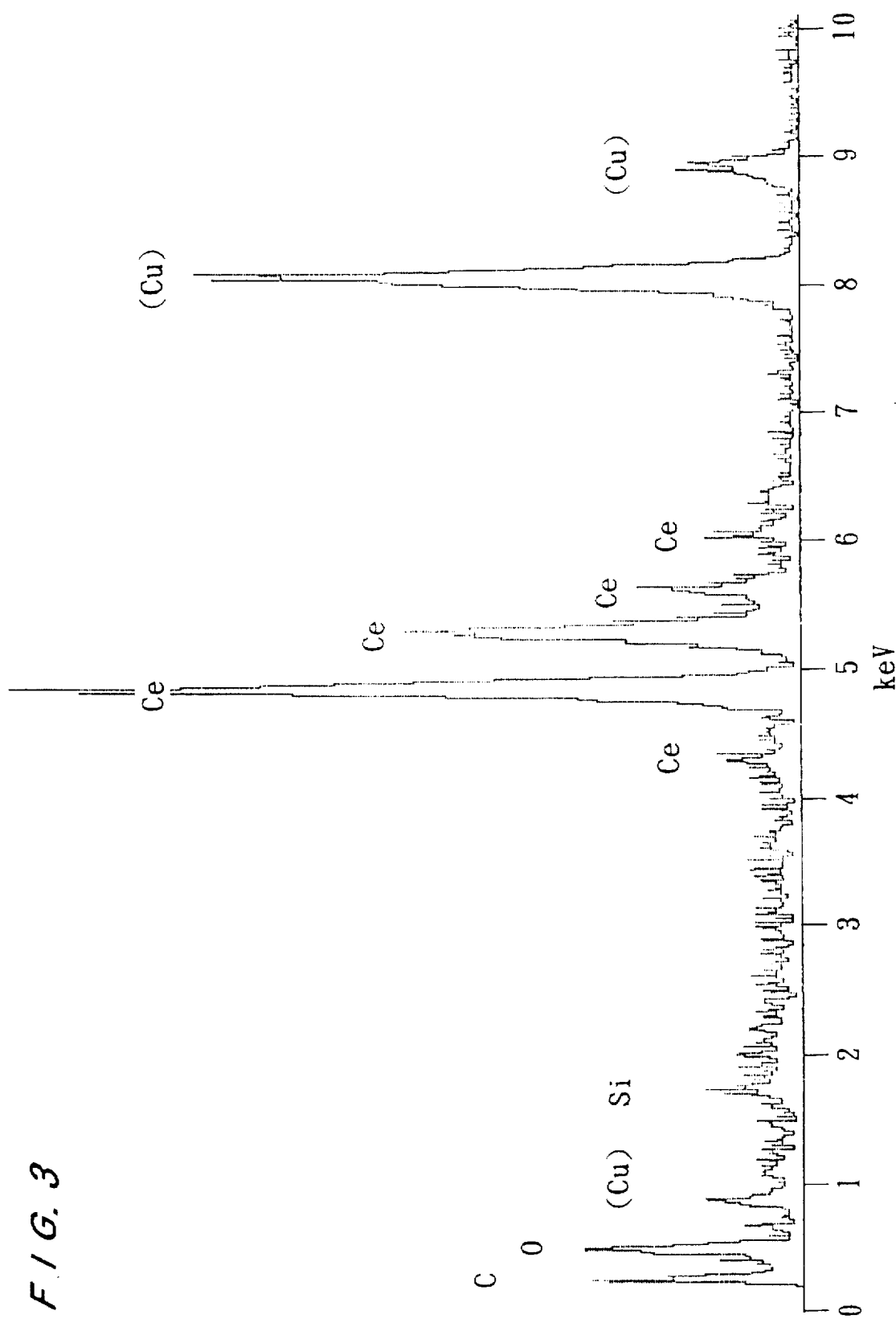
FIG. 3 is a chart obtained by EDX elemental analysis of another particle taken from the slurry polishing agent (B) prepared in Example 1.
Figure 4:
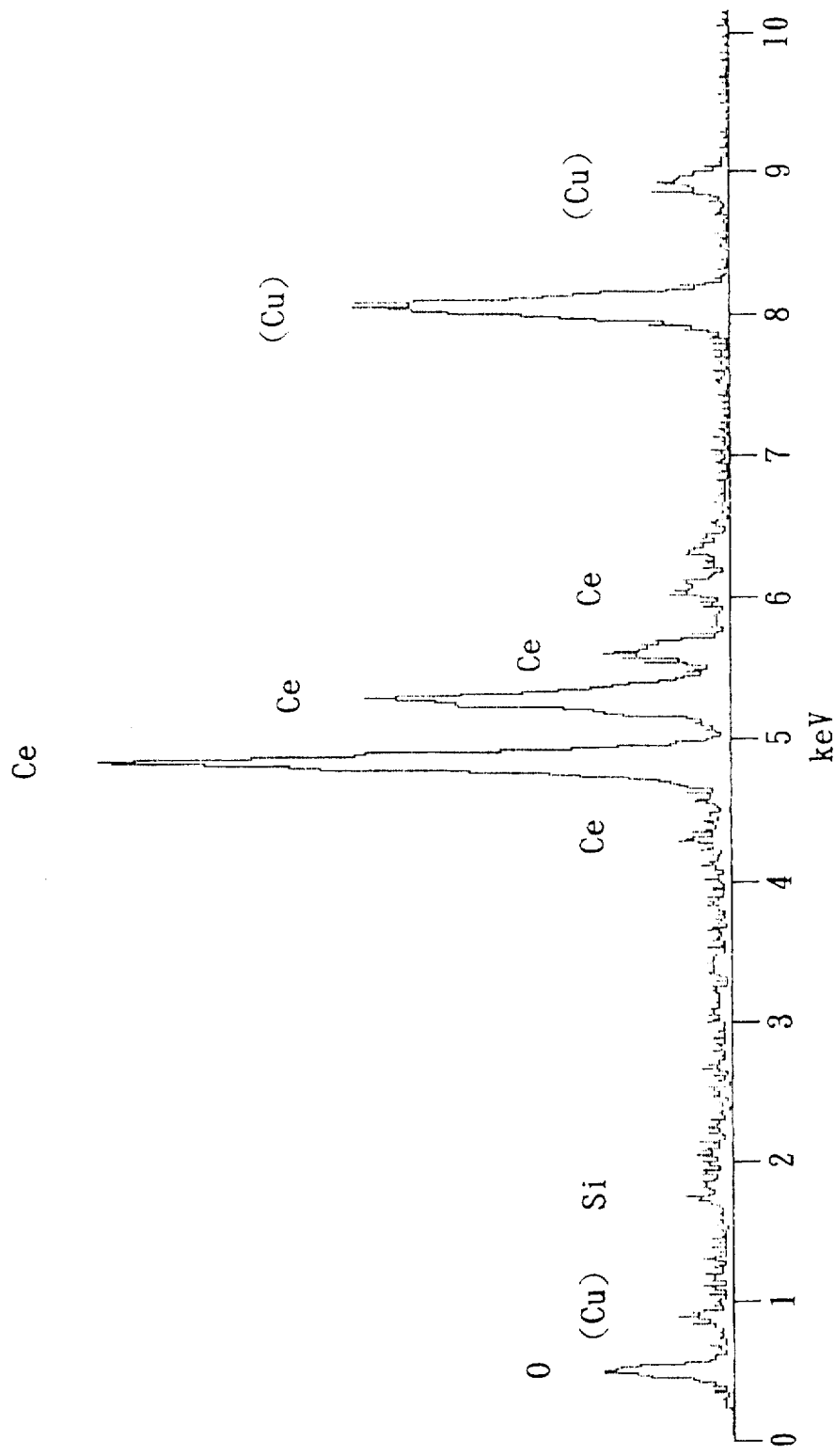
FIG. 4 is a chart obtained by EDX elemental analysis of a still another particle taken from the slurry polishing agent (B) prepared in Example 1.
Figure 5:
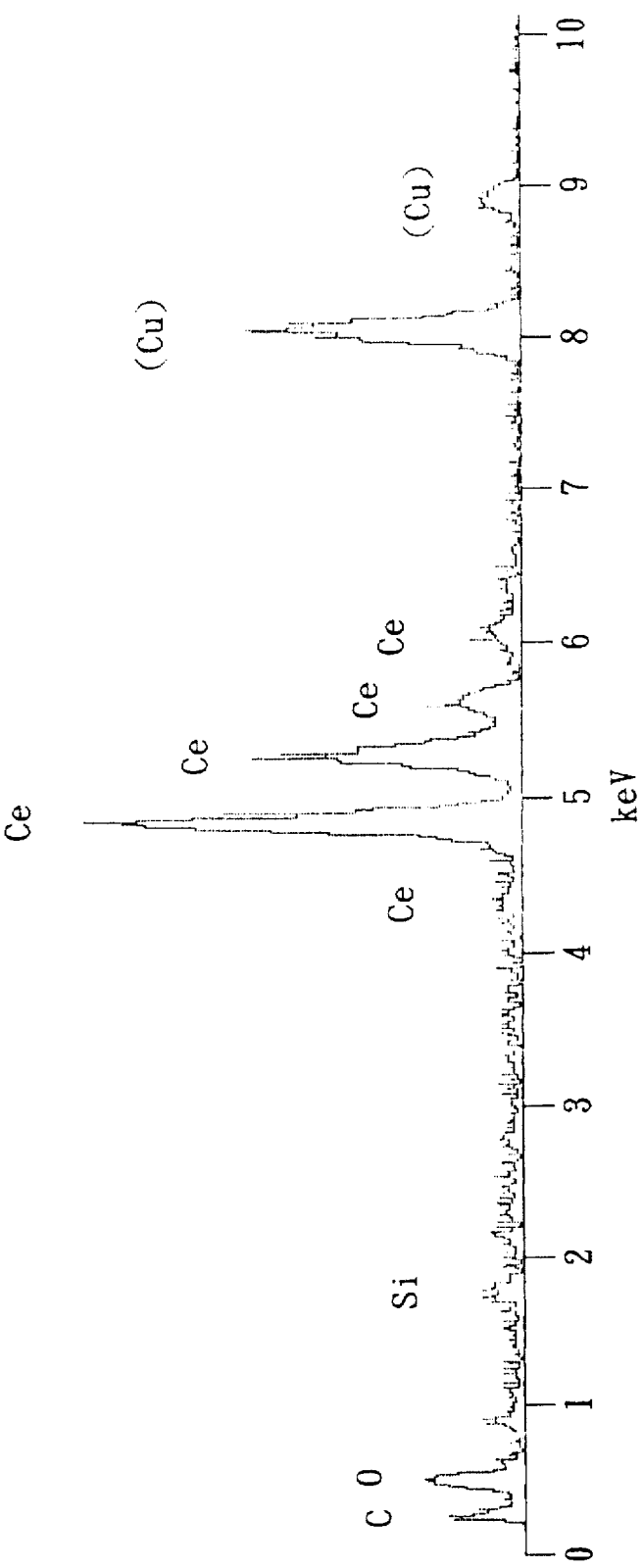
FIG. 5 is a chart obtained by EDX elemental analysis of a further particle taken from the slurry polishing agent (B) prepared in Example 1.
Figure 6:
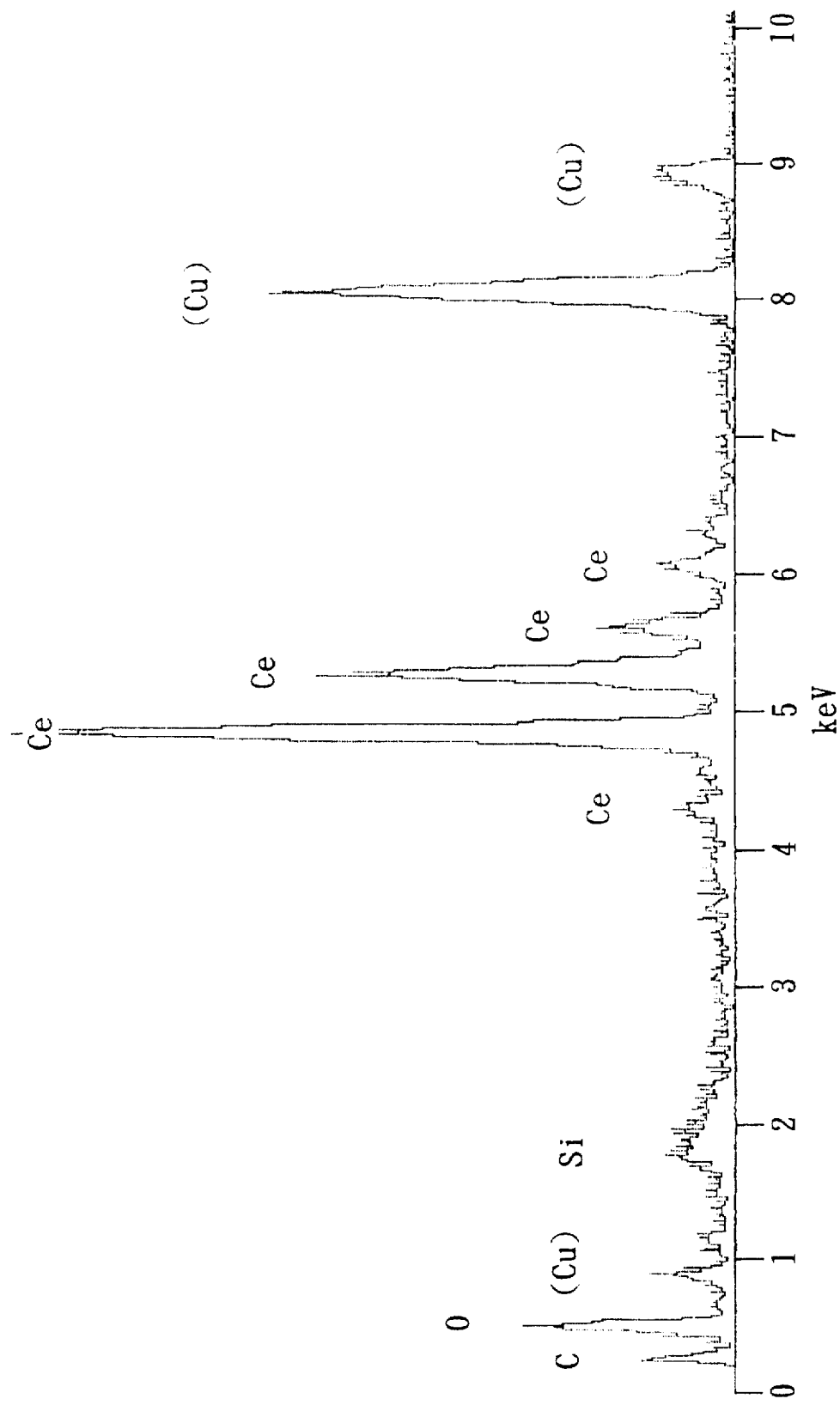
FIG. 6 is a chart obtained by EDX elemental analysis of a still further particle taken from the slurry polishing agent (B) prepared in Example 1.

The inventors of this invention have repeatedly conducted various investigations to achieve the foregoing objects. More specifically, silica sol (Snow Tex O; $SiO_2$ content 20%; available from Nissan Chemical Industries, Ltd.) and a slurry of $CeO_2$ fine particles are mixed with stirring using a stirring machine equipped with blades according to the disclosure of Japanese Examined Patent Publication (hereinafter referred to as "J. P. KOKOKU") No. Sho 53-6756 in which silica sol is mixed with a cerium oxide slurry in order to stabilize the polishing rate, but the inventors have failed to stably disperse the solid matter comprising $CeO_2$ in the liquid phase. However, it has been found that a stable slurry in which the solid matter is completely dispersed in the liquid phase can be obtained by drying such a stirred mixture and then subjecting the dried particulate material to deagglomeration using a wet pulverizing mill. Preferably, the dried material is heated to the range 150° to 1200° C., more preferably 800° to 900° C., prior to deagglomeration. Moreover, when observing the solid present in the stable slurry thus prepared with a transmission electron microscope and subjecting it to energy dispersive X-ray spectroscopic elemental analysis and X-ray diffractometry, it has been found that the solid is not a simple mixture, but a solid solution of $SiO_2$ and $CeO_2$. In addition, it has also been found that the foregoing object can effectively be accomplished by the use of the polishing agent thus prepared.

Under these circumstances, the inventors have further conducted various investigations to establish conditions for treating $CeO_2$ with $SiO_2$ which permit the formation of such solid solutions and the formation of a slurry free of any separation through precipitation even when allowing it to stand over a long time period.

As a result, it has been found that a stable slurry can be prepared by a method which comprises the steps of mixing, with stirring, $CeO_2$ fine particles or agglomerates, silica sol and a liquid (such as water); drying the mixture; mixing the material with a liquid; and then subjecting the mixture to deagglomeration using a wet pulverizing mill to give a slurry. This method permits the formation of a slurry in which the solid content is completely dispersed in the liquid.

It has been found that the foregoing slurry polishing agent in a highly dispersed state ensures a stable polishing rate even in the neutral pH range and the polishing rate is found to be comparable to or higher than that observed for the conventional cerium oxide polishing agents.

It has also been found that a stable slurry can likewise be prepared by a method which comprises the steps of mixing, with stirring, $CeO_2$ fine particles, silica sol and a liquid (such as water); drying the mixture; subjecting the dried particulate material to a thermal treatment at a high temperature and then cooling the material; mixing the material with a liquid; and then subjecting the mixture to deagglomeration using a wet pulverizing mill to give a slurry. This method permits the formation of a solid solution of $CeO_2$ and $SiO_2$ and accordingly, permits the formation of a slurry in which the solid content is completely dispersed within the liquid. The reason why the solid particles are well-dispersed in the liquid would be that the formation of the solid solution promotes polarization of individual particles and correspondingly inhibits agglomeration of particles and that only small agglomerates are formed.

It has likewise been found that the foregoing solid solution-containing slurry polishing agent in a highly dispersed state ensures a stable polishing rate even in the neutral pH range and the polishing rate is found to be about 45% higher than that observed for the conventional cerium oxide polishing agents within the neutral pH range.

Polishing tests carried out using this slurry polishing agent indicate that the torque to rotate the substrate thereof is lower than that observed for the fine particulate cerium oxide polishing agent proposed in Japanese Patent Application Serial No. Hei 6-272761 and there is not observed any trouble such as any vibration of the polishing machine even if carrying out the polishing while applying a high load thereto.

The fine particulate polishing agents of the present invention present in the slurry polishing agents which are prepared by the foregoing methods can comprise a solid solution of cerium oxide and silicon oxide as will be proved in Examples given later. Each fine particle may essentially comprise the solid solution of $CeO_2$ and $SiO_2$ or may be a mixture of fine particles containing the solid solution of $CeO_2$ and $SiO_2$ and $CeO_2$ fine particles. In this connection, a "fine particle containing the solid solution of $CeO_2$ and $SiO_2$," as used herein may be a particle consisting completely of the solid solution or a particle which comprises the solid solution at least at the surface layer thereof, depending on the production conditions.

In the fine particulate polishing agent of the present invention, the weight ratio of $CeO_2$ to $SiO_2$ present in the solid solution preferably ranges from 100:0.1 to 100:10. This is because if the ratio is less than 100:0.1 (i.e., the relative amount of $SiO_2$ is small), the intended dispersion effect cannot be expected, while if it is more than 100:10 (i.e., the relative amount of $SiO_2$ is large), the resulting polishing agent tends to have a reduced polishing rate.

The average particle size of the fine particulate polishing agent according to the present invention preferably ranges from 0.01 to 0.2 μm and more preferably 0.01 to 0.1 μm, while taking into consideration the surface roughness achieved by the use of the polishing agent, the polishing rate and the dispersibility thereof in a medium (water). This is because if the average particle size thereof is less than 0.01 μm, the polishing agent has only a low polishing rate, while if it exceeds 0.2 μm, the surface roughness achieved by the polishing agent is increased.

The cerium oxide fine particles used as an ingredient in the production method of the present invention are cerium oxide fine particles having the same average particle size as that of the final fine particulate polishing agent of such fine particles. Moreover, the cerium oxide fine particles may be those obtained by calcining cerium carbonate, cerium oxalate, cerium acetate or the like at high temperature to obtain cerium oxide and pulverizing it with, for example, a bead mill, or those obtained by adding an alkali to a solution containing cerium(III) nitrate, cerium(IV) nitrate, cerium sulfate, cerium chloride or the like to precipitate cerium oxide fine particles.

The silica sol used in the invention is not restricted to specific one and may be any commercially available one.

Moreover, the liquid used in the invention is not likewise limited to any specific one and is in general water.

In the production method of the invention, the weight ratio: cerium oxide fine particles/silica sol (as expressed in terms of the solid content thereof)/liquid preferably ranges from 100/0.2/50 to 100/20/500 and more preferably 100/1/100 to 100/15/200 while taking into consideration easiness of the operations for preparing the slurry polishing agent, the dispersion stability, the polishing rate, the surface roughness, the surface flatness and so on.

In the present invention, the processes for mixing with stirring, for drying and for deagglomeration with a wet pulverizing mill can be carried out by any means known to those skilled in the art.

The thermal treatment at a high temperature used in the production method of the present invention is carried out at a temperature preferably ranging from 150° to 1200° C. and more preferably 800° to 900° C. If it is lower than 150° C., little effect is expected by the thermal treatment while if it is higher than 1200° C., strong agglomerations result and deagglomeration will be impossible.

The slurry polishing agent prepared according to the method of the present invention has a neutral pH. If the slurry polishing agent as such is used for polishing quartz glass as a polishing agent, the slurry polishing agent ensures a polishing rate not less than 45% higher than that observed for the conventional fine particulate cerium oxide polishing agent, low torque to rotate the substrate and surface roughness at least comparable to that achieved by the use of colloidal silica.

As has been discussed above in detail, the slurry polishing agent of the present invention can ensure the achievement of surface roughness comparable to or superior to that achieved by the colloidal silica polishing agents and a high polishing rate at least comparable to that achieved by the conventional cerium oxide polishing agents. Moreover, the slurry polishing agent has good dispersibility in a medium (water) and is stably dispersed in the medium and permits the one-stage precision polishing of the surface of a substrate which usually requires the two-stage polishing.

The present invention will hereinafter be described in more detail with reference to the following non-limitative working Examples, but the present invention is not restricted to these specific Examples.

EXAMPLE 1

The following three components were admixed together:

| Component | Amount |
| --- | --- |
| Highly pure cerium oxide (average particle size measured by SEM: about 0.08 μ m) | 2 kg |
| Silica sol ($SiO_2$ content: 20%; Snow Tex O available from Nissan Chemical Industries, Ltd.) | 0.3 l |
| Pure water | 2 l | and they were sufficiently mixed with stirring using a stirring machine to give a slurry. The resulting slurry was evaporated to dryness in an oven whose temperature was set at 100° C. to give a powdery product. Thereafter, pure water was added to the powder to again disperse it in a medium and to thus form a slurry, followed by deagglomeration of the slurry using a colloid mill to give a slurry polishing agent (A). The fine particles present in the slurry were found to have an average particle size of 0.08 μm.

The foregoing three components were admixed in the same mixing ratio used in the preparation of the slurry polishing agent (A) and the resulting slurry was evaporated to dryness to give a powdery product, followed by maintaining the product in an electric furnace maintained at 800° C. for 5 hours and then gradually cooling it. A slurry polishing agent (B) was then prepared from the resulting powder by subjecting a slurry thereof to deagglomeration using a colloid mill like the preparation of the slurry polishing agent (A). The fine particles present in the slurry were found to have an average particle size of 0.09 μm.

By way of comparison, there were provided a slurry polishing agent (C) which was prepared by mixing the foregoing three components in the same mixing ratio used in the preparation of the slurry polishing agent (A), followed by sufficiently mixing with stirring using a stirring machine and subjecting the slurry to evaporation to dryness in an oven maintained at 100° C. and dispersing it in water; a slurry polishing agent (D) which was prepared by the same procedures used for preparing the slurry polishing agent (A) except that the step for evaporation to dryness was omitted and that the slurry obtained by the mixing step was thus directly subjected to deagglomeration; a slurry polishing agent (E) prepared by dispersing highly pure cerium oxide per se in pure water to give a slurry and then subjecting to deagglomeration in a colloid mill; and a slurry polishing agent (F) prepared by holding highly pure cerium oxide per se in an electric furnace maintained at 800° C. for 5 hours, then gradually cooling it and dispersing the heat-treated cerium oxide in water.

A small amount of the slurry polishing agent (B) was admixed with pure water, followed by dropping the resulting liquid on a microgrid and then drying the same to form a sample for transmission electron micrographic observation. An example of the transmission electron micrograph (magnifying power: 600,000) of the sample is attached hereto as FIG. 1. In addition, 5 particles having a particle size ranging from 20 nm to 100 nm were selected and then an electron beam was directed upon an area of about 3 nmφ of each particle (hereinafter referred to as site 1, 2, 3, 4 or 5) to carry out energy dispersive X-ray spectroscopic elemental analysis (EDX elemental analysis) and to thus perform quantitative analysis of Ce and Si present therein. The charts obtained by EDX elemental analysis are also attached hereto as FIGS. 2 to 6. Moreover, the contents (wt % and atomic percentage (atm %)) of Ce and Si and accuracy of these sites determined are summarized in Table 1.

TABLE 1

| Site | Element | X-Ray | Amount (wt %) | Amount (Atm %) | Accuracy (2 σ) |
|---|---|---|---|---|---|
| 1 | Ce | L-rays | 98.37 | 92.36 | 1.39 |
|   | Si | K-rays | 1.63 | 7.64 | 0.35 |
| 2 | Ce | L-rays | 98.76 | 94.12 | 1.34 |
|   | Si | K-rays | 1.24 | 5.88 | 0.33 |
| 3 | Ce | L-rays | 99.57 | 97.88 | 1.05 |
|   | Si | K-rays | 0.43 | 2.12 | 0.22 |
| 4 | Ce | L-rays | 99.13 | 95.80 | 1.58 |
|   | Si | K-rays | 0.87 | 4.20 | 0.44 |
| 5 | Ce | L-rays | 98.73 | 93.99 | 0.91 |
|   | Si | K-rays | 1.27 | 6.01 | 0.20 |

As is clear from the data listed in Table 1, each particle is a $CeO_2$ particle having an Si content ranging from 0.4 to 1.7% by weight. To more strictly examine these particles, i.e., to inspect them for the presence of Si incorporated into $CeO_2$ particles in the form of a solid solution, it is necessary to inspect each particle for the presence of any change in the lattice constant as determined by X-ray diffractometry. The ionic radius of $Ce^{4+}$ having a coordination number of 6 is 0.80 Å and that of $Si^{4+}$ having a coordination number of 6 is 0.40 Å. Consequently, the lattice constant of the Si-containing $CeO_2$ would be smaller than that of $CeO_2$ if Si is incorporated into $CeO_2$ in the form of a solid solution.

Thus, the lattice constants of the foregoing slurry polishing agents (B), (C) and (F) were determined by X-ray diffractometry. The results thus obtained are as follows (see the following Table 2).

TABLE 2

| | Lattice Constant ( Å ) | | |
|---|---|---|---|
| Polishing agent | B | C | F |
| Lattice Constant a | 5.411 | 5.412 | 5.412 |
| Lattice Constant b | 5.411 | 5.412 | 5.412 |
| Lattice Constant c | 5.411 | 5.412 | 5.412 |

The data listed in Table 2 clearly indicate that, in the polishing agents (C) and (F), Si is not incorporated into $CeO_2$ particles in the form of a solid solution, while Si is incorporated into $CeO_2$ particles in the form of a solid solution, in the polishing agent (B).

Moreover, the sedimentation behaviors of the resulting slurries were examined by the following method. Each slurry polishing agent (A), (B), (D) or (E) was diluted with water to a solid content of 5% by weight, then one liter each of these diluted slurries was dispensed into a one liter graduated measuring cylinder, followed by sufficiently shaking the slurry, allowing it to stand, sampling 80 cc of the uppermost portion thereof as time proceeds and determining the concentration of solid matter present therein. The results thus obtained are summarized in the following Table 3.

TABLE 3

| | Results of Sedimentation Test (% by weight) | | | | | |
|---|---|---|---|---|---|---|
| | Sampling Time | | | | | |
| Slurry | 0 | 30 min | 60 min | 1 Day | 3 Days | 5 Days |
| (A) | 5.0 | 5.0 | 5.0 | 4.3 | 3.8 | 3.5 |
| (B) | 5.0 | 5.0 | 5.0 | 4.8 | 4.4 | 4.2 |
| (D) | 5.0 | 2.5 | 1.3 | <0.1 | <0.1 | <0.1 |
| (E) | 5.0 | 1.5 | 0.3 | 0 | 0 | 0 |

EXAMPLE 2

Figure 7:
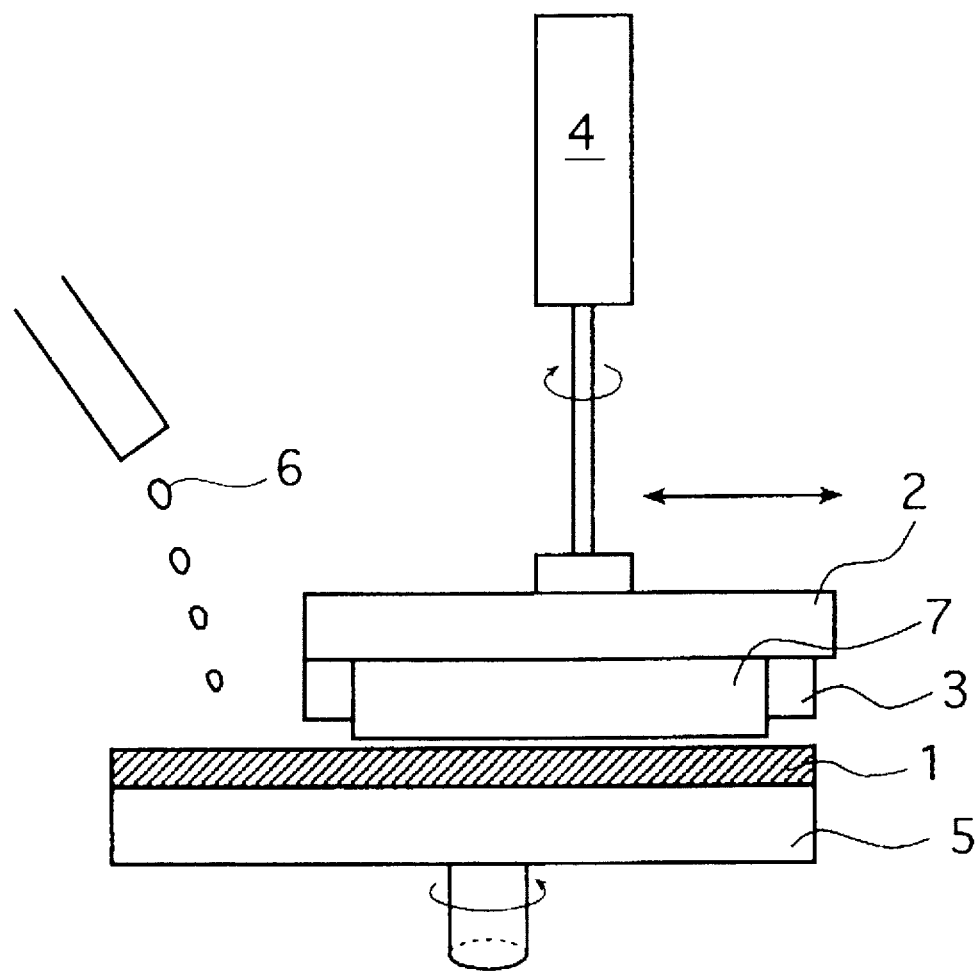
FIG. 7 is a schematic diagram showing the polishing machine used in Example 2.

The slurry polishing agents (A), (B), (D) and (E) prepared in Example 1 were used in polishing performed under the following conditions to determine the polishing rates and the results were compared with one another. The pH of each slurry was changed between 2 and 12 using hydrochloric acid or potassium hydroxide during the polishing test. The concentration of each slurry was adjusted to 15% and the polishing was carried out using a polishing machine as shown in FIG. 7. In FIG. 7, the reference numeral 1 represents a polishing agent cloth; 2 a holder for a subject to be polished; 3 a tool for pressing the subject to be polished; 4 an air cylinder; 5 a surface plate for polishing; 6 a slurry polishing agent; and 7 a subject to be polished.

Subject to be Polished: fused quartz (50×50×2 mm)
Polishing Cloth: SUBA600 available from Rodale-Nitta
Pressure for Polishing: 0.12 Kg/cm²
Polishing Time: 20 minutes To examine stability of polishing rates, the procedures for polishing were repeated 10 times for each slurry having a pH value at which the slurry ensured the highest polishing rate.

In addition, the pH value of each slurry was determined before the first polishing and after the 10th polishing. These results are listed in the following Table 4.

TABLE 4

| | Comparison of Polishing Rates (μ m/min) | | | |
|---|---|---|---|---|
| | Slurry | | | |
| Polishing Test No. | (A) | (B) | (D) | (E) |
| 1 | 1.3 | 1.6 | 1.1 | 1.2 |
| 2 | 1.2 | 1.4 | 1.0 | 1.1 |
| 3 | 1.1 | 1.5 | 1.1 | 1.1 |
| 4 | 1.2 | 1.6 | 1.0 | 1.0 |
| 5 | 1.3 | 1.8 | 1.0 | 1.1 |
| 6 | 1.2 | 1.7 | 0.9 | 1.2 |
| 7 | 1.2 | 1.5 | 1.0 | 1.1 |
| 8 | 1.1 | 1.6 | 1.0 | 1.2 |
| 9 | 1.2 | 1.6 | 1.0 | 1.3 |
| 10 | 1.2 | 1.7 | 1.1 | 1.1 |
| Average | 1.2 | 1.6 | 1.0 | 1.1 |
| Initial pH Value | 7.5 | 7.5 | 10.5 | 12.0 |
| Final pH Value | 7.2 | 7.3 | 10.7 | 12.3 |

EXAMPLE 3

The same procedures used in Example 2 were repeated except that only the slurry polishing agent (B) prepared in Example 1 was used, that MH Type polishing cloth available from Rodale-Nitta was substituted for the polishing cloth used in Example 2 and that the polishing pressure was adjusted to 0.4 Kg/cm². As a result, the torque to rotate the substrate was low enough that there was not observed any vibration of the polishing machine and the polishing rate was found to be high on the order of 3.0 μm/min.

In this respect, the MH Type polishing cloth available from Rodale-Nitta usually requires high torque to rotate the substrate when using a cerium oxide polishing agent. For this reason, it is concluded that the polishing agent (B) requires lower torque to rotate the substrate than the conventional cerium oxide requires.

EXAMPLE 4

Polishing was carried out under the polishing conditions defined in Example 2, using the slurry polishing agent (B) prepared in Example 1 and then the surface roughness was determined using a surface roughness meter PC-10 available from Tencall•Japan Co., Ltd.

By way of comparison, polishing was carried out under the polishing conditions defined in Example 2, using colloidal silica: Compol EX available from Fujimi Incorporated Co., Ltd. at a solid content of 30% and then the surface roughness was likewise determined using the same device. The results thus obtained are listed in the following Table 5.

TABLE 5

| Comparison of Surface Roughness ( Å ) | | |
|---|---|---|
| | Ra | Rt |
| Slurry Polishing Agent (B) | 5 | 15 |
| Colloidal Silica Abrasive | 5 | 18 |

What is claimed is:

1. A fine particulate polishing agent comprising a solid solution of cerium oxide and silicon oxide, wherein the weight ratio of cerium oxide to silicon oxide present in the solid solution ranges from 100:0.1 to 100:10.

2. The fine particulate polishing agent of claim 1, wherein the fine particles have an average particle size ranging from 0.01 to 0.2 μm.

3. The fine particulate polishing agent of claim 2, wherein the fine particles have an average particle size ranging from 0.01 to 0.1 μm.

4. A polishing slurry comprising a fine particulate polishing agent comprising a solid solution of cerium oxide and silicon oxide, wherein the weight ratio of cerium oxide to silicon oxide present in the solid solution ranges from 100:0.1 to 100:10.

5. The polishing slurry of claim 4, wherein the fine particles have an average particle size ranging from 0.01 to 0.2 μm.

6. The polishing slurry of claim 5, wherein the fine particles have an average particle size ranging from 0.01 to 0.1 μm.

7. A method for preparing a polishing slurry comprising the steps of:

mixing, with stirring, cerium oxide fine particles or agglomerates, silica sol, and a liquid;

drying the mixture;

mixing the material with a liquid; and then subjecting the mixture to deagglomeration using a wet pulverizing mill to give a polishing slurry whose solid content is completely dispersed in the liquid, and wherein the weight ratio of cerium oxide to silicon oxide ranges from 100:0.1 to 100:10.

8. The method of claim 7, wherein the dried mixture is subjected to a high temperature thermal treatment ranging from 150° to 1,200° C., and then cooled.

9. The method of claim 8, wherein said high temperature thermal treatment is conducted at 800° to 900° C.

10. A polishing slurry produced by the method of claim 7.

11. A one-stage method of precision polishing a substrate comprised mainly of a silicon compound, which comprises:

polishing the surface of the substrate with a polishing slurry, said polishing slurry comprising a fine particulate polishing agent which comprises a solid solution of cerium oxide and silicon oxide, and wherein the weight ratio of cerium oxide to silicon oxide present in the solid solution ranges from 100:0.1 to 100:10.

* * * * *